United States Patent
Carpenter et al.

(10) Patent No.: US 7,260,755 B2
(45) Date of Patent: Aug. 21, 2007

(54) SKEWED INVERTER DELAY LINE FOR USE IN MEASURING CRITICAL PATHS IN AN INTEGRATED CIRCUIT

(75) Inventors: Gary Dale Carpenter, Austin, TX (US); Ramyanshu Datta, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 247 days.

(21) Appl. No.: 11/071,554

(22) Filed: Mar. 3, 2005

(65) Prior Publication Data

US 2006/0200716 A1  Sep. 7, 2006

(51) Int. Cl.
- *G01R 31/28* (2006.01)
- *G06K 5/04* (2006.01)
- *H03M 13/00* (2006.01)

(52) U.S. Cl. .............. 714/724; 714/733; 714/700; 714/709

(58) Field of Classification Search ............ None
See application file for complete search history.

(56) References Cited

U.S. PATENT DOCUMENTS

| | | | | |
|---|---|---|---|---|
| 4,646,297 A | * | 2/1987 | Palmquist et al. | 714/700 |
| 5,386,150 A | * | 1/1995 | Yonemoto | 327/141 |
| 5,923,676 A | * | 7/1999 | Sunter et al. | 714/733 |
| 2005/0111537 A1 | * | 5/2005 | Sunter et al. | 375/226 |

OTHER PUBLICATIONS

Datta, et al., On-Chip Delay Measurement for Silicon Debug; Great Lakes Symposium on VLSI, pp. 145-148, ACM, Apr. 2004.
Needham, et al., DFT Strategy for Intel Microprocessors; International Test Conference, pp. 590-598, IEEE, Oct. 1998.
Datta, et al., Delay Fault Testing and Silicon Debug Using Scan Chains; European Test Conference, pp. 46-51, IEEE, 2004.

* cited by examiner

*Primary Examiner*—Guy Lamarre
*Assistant Examiner*—John J. Tabone, Jr.
(74) *Attorney, Agent, or Firm*—Casimer K. Salvs; Dillon & Yudell LLP

(57) ABSTRACT

An integrated circuit includes a testable delay path. A transition of a delay path input signal causes a subsequent transition of a delay path output signal. A pulse generator receives the delay path input and output signals and produces a pulse signal having a pulse width indicative of the delay between the delay path input and output signal transitions. A delay line receives the pulse signal from the pulse generator. The delay line generates information indicative of the pulse signal pulse width. The delay line may include multiple stages in series where each stage reduces the pulse width of the pulse signal. The delay line may include a high skew inverter having PMOS and NMOS transistors having significantly different gains. The pulse generator is configured to produce a positive going pulse signal regardless of whether the delay path is inverting or non-inverting.

15 Claims, 6 Drawing Sheets

SKEWED INVERTER DELAY LINE FOR USE IN MEASURING CRITICAL PATHS IN AN INTEGRATED CIRCUIT

This invention was made with Government support under IVY GRANT H98230-04-C-0920. THE GOVERNMENT HAS CERTAIN RIGHTS IN THIS INVENTION.

BACKGROUND

1. Field of the Present Invention

The invention is in the field of integrated circuit testing and, more specifically, characterizing the delay associated with critical paths in an integrated circuit.

2. History of Related Art

Scaling trends in the semiconductor industry have resulted in a doubling of integrated circuit operating frequencies every two years. Scaling trends have also led to smaller dimensions causing the number of transistors on a chip to double every two years. In contrast, die sizes have only increased by approximately 14% every year. As a result, integrated circuits are much denser in terms of the percentage of the die size area that is populated by a transistor or other device. This increased density has severely limited manufacturing controllability as well as the ability to observe and characterize the integrated circuit. As a result, the testing, debugging, and diagnosing of modern integrated circuits is extremely challenging. Nevertheless, there is a clear necessity to characterize the post-silicon electrical behavior of integrated circuits because design models and simulation packages cannot fully account for the variability that is introduced by the manufacturing process.

Referring to FIG. 1, a conceptual illustration of a fundamental test or characterization problem is shown. In FIG. 1, an integrated circuit 100 is represented as having two basic types of elements, namely, state-holding elements or latches 102-1 and 102-2 (collectively or generically referred to herein as latch(es) 102) and combinational logic elements 104-1 and 104-2 (generically or collectively referred to herein as combinational logic 104). The latches 102 depicted in FIG. 1 may represent multiple latches (not shown individually) and may be more accurately referred to as latch stage(s) 102.

The latches in a latch stage 102 are driven by a system clock 106. The value at the output of a latch following an active transition of the system clock 106 reflects the value at an input of the latch when the clock transitioned. Once the output achieves a steady state following the system clock transition, the output value is static until the next active transition of the system clock.

The combinational logic elements 104 represent logic functions such as logical AND, NAND, OR, NOR, and EXOR gates as well as logical inverters. The amount of combinational logic that may be placed between a pair of latching stages 102 is limited. More specifically, combinational logic, as is the case for all real circuits, exhibits signal delay. A signal transition (represented by reference numeral 108) at the input to combinational logic 104 requires a finite amount of time to produce a signal transition (109) at the output of combinational logic 104. Thus, there is a delay between transition 108 and transition 109 and this delay is a characteristic of the circuit path from the input signal to the output signal.

Meanwhile, system clock 106 is oscillating at a predetermined frequency. System clock 106 includes a first transition 118 that clocks the transition 108 at the input to combinational logic 104-1. If the amount of time between system clock transition 118 and the next active transition 119 of clock signal 106 is less than the amount of delay between transitions 108 and 109, transition 109 will not occur until after the clock transition 119. This condition is referred to as a delay fault because the excessive delay in combinational logic 104-1 causes a fault when transition 109 does not get latched through latch stage 102-2.

It would be highly desirable to implement a technique to measure the post-silicon delay between transition 108 and 109 for one or more critical paths. It would be further desirable if the implemented solution did not require significant die area and did not require a significant modification in testing equipment.

SUMMARY OF THE INVENTION

The identified objective is addressed in the present invention by an integrated circuit that includes one or more testable delay paths. A transition of a delay path input signal causes a subsequent transition of a delay path output signal. A pulse generator receives the delay path input and output signals and produces a pulse signal having a pulse width indicative of the delay between the delay path input and output signal transitions. A delay line receives the pulse signal from the pulse generator. The delay line generates information indicative of the pulse signal pulse width. The delay line may include multiple stages in series where each stage reduces the pulse width of the pulse signal until the pulse width is less than a threshold value in time or duration. The delay line may include a high skew inverter having PMOS and NMOS transistors having significantly different gains. In one embodiment, the pulse generator is configured to produce a positive going pulse signal regardless of whether the delay path is inverting or non-inverting.

BRIEF DESCRIPTION OF THE DRAWINGS

Other objects and advantages of the invention will become apparent upon reading the following detailed description and upon reference to the accompanying drawings in which.

Figure 1:
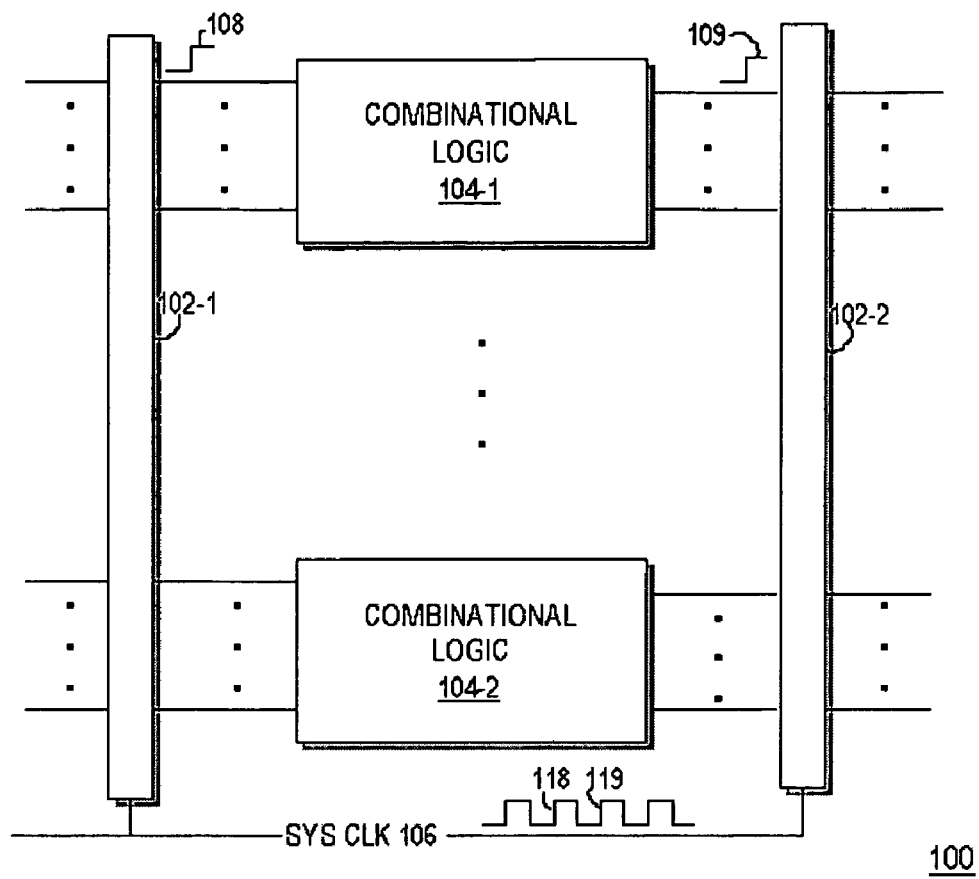
FIG. 1 is a diagram illustrating selected components of an integrated circuit emphasizing the delay fault problem.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Generally speaking, the invention encompasses incorporating delay measuring circuitry within an integrated circuit. The delay measuring circuitry facilitates the characterization of the delay associated with one or more circuit paths referred to herein as delay paths. The delay measuring circuitry includes a pulse generator that receives a two signals, an input to the delay path of interest (the delay path input signal) and an output from the delay path (the delay path output signal). The pulse generator generates a pulse signal having a pulse width equal to the delay between a transition on the delay path input signal and the resulting transition at the delay path output signal.

The pulse signal is provided to a multi-stage delay line. Each stage in the delay line decreases the width of the pulse. The output of each stage in the delay line is connected to latching circuitry configured to latch a signal if the width of the pulse at that stage exceeds some threshold time or duration. At the delay line stage where the pulse width falls below the threshold time or duration, the latching circuitry is unable to latch the pulse signal. By reading out the values of the delay line latches, one can determine the width of the pulse produced by the pulse generator and, from there, the on-chip delay associated with the delay path.

The delay measuring circuitry may include some elements that are unique to each delay path and other elements that are shared among two or more of the delay paths. The delay measuring circuitry may be accessible via conventional scan in techniques to enable one to configure the integrated circuit in a desired state prior to testing, to calibrate the delay line, and to read the outputs of the latches in the delay line.

Figure 2:
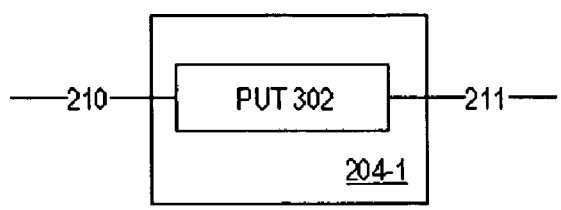
FIG. 2 illustrates a path under test within a block of combinational logic.

Turning now to the drawings, FIG. 2 introduces the concept of a path under test (PUT) 302. With reference back to FIG. 1, each integrated circuit may be thought of for purposes of this invention as including a series of latching stages and combination logic within each of the stages. In FIG. 2, a block of combinational logic 204-1 is depicted. The PUT 302 is preferably the circuit path within combinational logic block 204-1 that is thought to have the longest delay.

The delay measuring circuitry of the present invention is preferably confined to a few of the circuit paths thought to have the longest or worst case delay. Computer aided design and computer aided simulation are employed to identify circuit paths thought to exhibit the longest delays. Once a number of worst case delay paths has been identified, delay measuring circuitry can be incorporated into each of the worst case delay paths.

Figure 3:
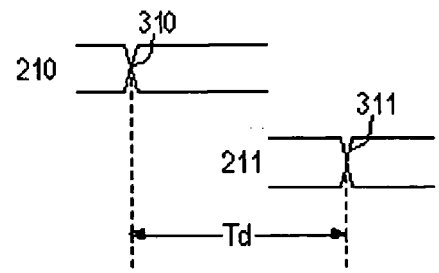
FIG. 3 illustrates the delay between a signal transition at an input to the path under test of FIG. 2 and a resulting output.

Referring to FIG. 3, the depicted timing diagram illustrates the delay associated with PUT 302 of FIG. 2. As depicted in FIG. 3, input signal 210 includes a transition 310 from either a high signal to a low signal or vice versa. In the preferred embodiment, the delay measuring circuitry is able to accommodate either a positive going transition or a negative going transition. In response to the input transition 310, signal 211 at the output of PUT 302 transitions (311) sometime later. The time elapsing between input signal transition 310 and output signal transition 311 is referred to as the path delay (Td).

Figure 4:
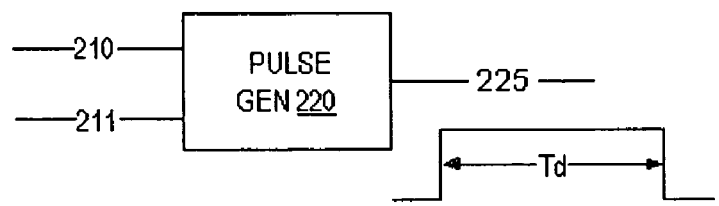
FIG. 4 illustrates a pulse generator receiving the input to and the output from the path under test of FIG. 2 emphasizing the pulse generator's ability to generate a pulse width equal to the delay depicted in FIG. 3.

An embodiment of the invention enables one to determine the value of Td by first generating a pulse having a width of Td. This embodiment is represented in FIG. 4 where a pulse generator 220 receives delay path input signal 210 and delay path output signal 211. Pulse generator 220 according to the preferred embodiment of the invention produces a pulse signal 225 at its output. The width of pulse signal 225 (the pulse width) is equal to the delay Td. In one embodiment, there is a pulse generator 220 associated with each delay path of interest.

Figure 5:
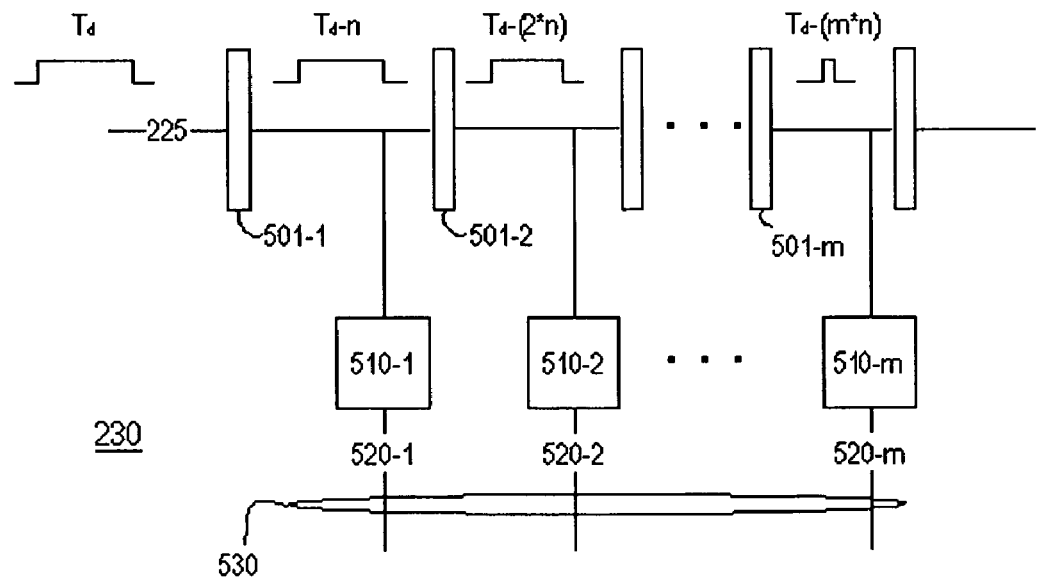
FIG. 5 illustrates a delay line according to one embodiment of the invention.

The pulse generator output signal (pulse signal) 225 is provided to a delay line that generates information indicative of the pulse width of pulse signal 225. An embodiment of such a delay line is depicted in FIG. 5 and identified by reference numeral 230. Before discussing details of delay line 230, additional details of pulse generator 220 are discussed.

It is beneficial if the delay path measuring circuitry of the present invention includes some elements that are shared among many delay paths. In one implementation, for example, it is desirable to use a single delay line 230 for all delay paths to be tested. Sharing of delay line 230 desirably conserves valuable die area. In addition, sharing delay line 230 among each instance of delay path measuring circuitry beneficially improves the consistency of the results because any pulse width measurement distortion introduced by delay line 230 is applied to each delay path circuit.

The use of a shared delay line 230 makes it beneficial, if not strictly required, for each pulse generator 220 to produce the same "type" of pulse signal 225. More specifically, it is preferable if each pulse generator 220 generates either a positive pulse (such as the one depicted in FIG. 4), where the leading transition is from low to high and the trailing transition is from high to low, or a negative pulse, where the leading transition is high to low and the trailing transition is from low to high. Generating like-type pulses according to the present is achieved using two different configurations of pulse generator 220, a first configuration 220-1 for non-inverting delay paths and a second configuration 220-2 for inverting delay paths.

Figure 6:
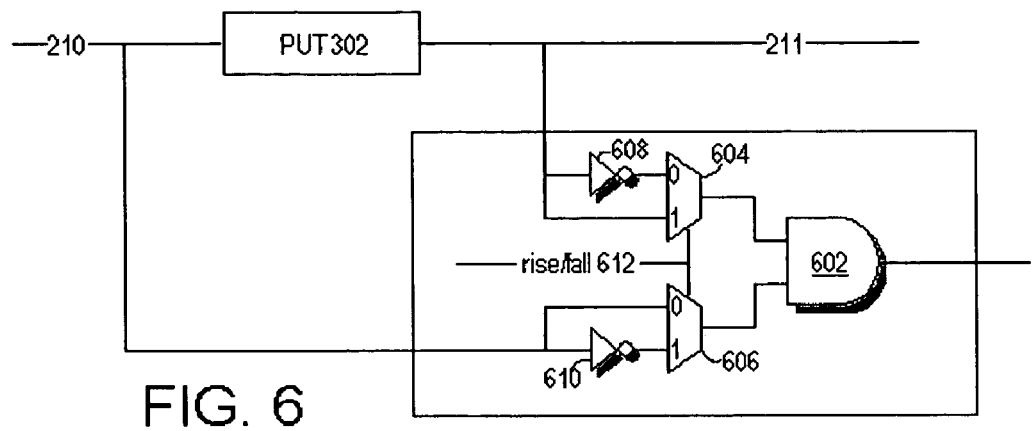
FIG. 6 illustrates a pulse generator of FIG. 4 suitable for non-inverting paths under test.

Referring to FIG. 6, a first type of pulse generator 220-1 is suitable for use with a non-inverting PUT 302. As its name implies, a non-inverting PUT 302 is a circuit path in which a positive transition of the delay path input signal 210 (FIG. 2) produces a positive transition at the delay path output signal 211. Similarly, a negative transition on input signal 210 produces a negative transition on input signal 211.

It may not be known whether the worst case delay associated with a PUT 302 is associated with a positive transition or a negative transition of the delay path input signal. The pulse generator 220-1 of FIG. 6 accommodates both cases. In this configuration, pulse generator 220-1 includes a pair of multiplexers 604 and 606, both controlled by a control signal identified as rise/fall signal 612.

When the worst case delay is associated with a positive transition on delay path input signal 210, rise/fall signal 612 is asserted to select the "0" input of multiplexers 604 and 606. In this case, the delay path input signal 210 is gated directly (uninverted) to a first input of AND gate 602. Simultaneously, the delay path output signal 211 is inverted by inverter 608 before connecting to a second input of AND gate 602. Following a positive transition of delay path input signal 210, both of the inputs to AND gate 602 are high until delay path output signal 211 transitions from low to high in response to the delay path input signal transition. Under these conditions, the output signal from gate 602 is a positive pulse having a duration or pulse width equal to the delay between the transition of delay path input signal 210 and the resulting transition on the delay path output signal 211.

When the worst case delay is associated with a negative transition on delay path input signal 210, rise/fall signal 612 is asserted to select the "1" input of multiplexers 604 and 606. In this case, the delay path input signal 210 is inverted by inverter 610 while the delay path output signal 211 is passed uninverted to AND gate 602. Under these conditions, the output of AND gate 602 is, again, a positive going pulse with a pulse width equal to the delay.

Figure 7:
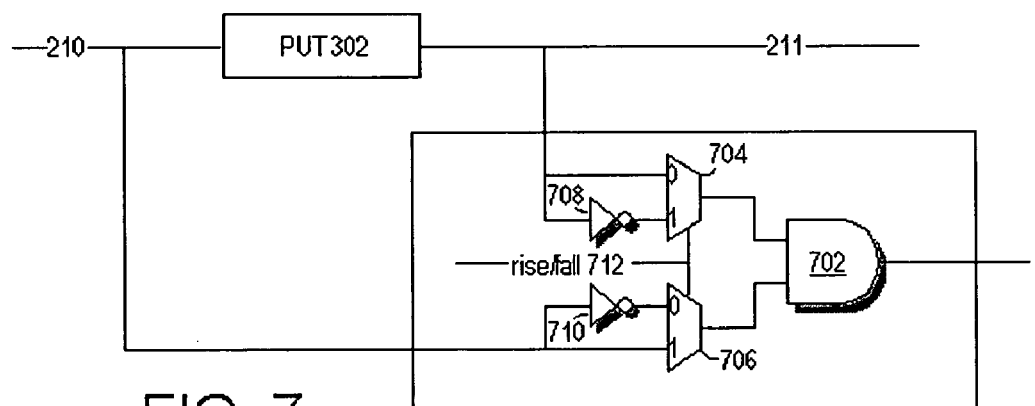
FIG. 7 illustrates a pulse generator of FIG. 4 suitable for inverting paths under test.

For situations in which PUT 302 is an inverting delay path (i.e., a positive transition on delay path input signal 210 produces a negative transition on delay path output signal 211 and vice versa), a second configuration of pulse generator 220-2 is used. Referring to FIG. 7, pulse generator 220-2 is similar to pulse generator 220-1. Pulse generator 220-2 includes an AND gate 702, a pair of multiplexers 704 and 706, and a pair of inverters 708 and 710. Delay path input signal 210 is connected directly to the "1" input of multiplexer 706 and to the "0" input of multiplexer 706 through inverter 710. Delay path output signal 211 is connected directly to the "0" input of multiplexer 704 and to the "1" input of multiplexer 704 through inverter 708. Rise/fall signal 712 provides the control input to multiplexers 708 and 710. Using analysis similar to that described above for pulse generator 220-1, it will be apparent that pulse generator 220-2, through appropriate control of rise/fall signal 712, is configured to produce a positive going pulse signal at the output of AND gate 702 for inverting delay paths, whether the delay path input signal transitions from high to low or vice versa.

Using the two implementations of pulse generator 220 described above, one embodiment of invention uses a single delay line 230 to which the pulse signal 225 produced by each pulse generator 220 is connected through appropriate multiplexing circuitry (described and illustrated below with reference to FIG. 9 and FIG. 10). The multiplexing circuitry controls which pulse generator 220 (i.e., which PUT 302) is connected to delay line 230. Generally speaking, delay line 230 is configured as a multistage circuit in which each stage causes a reduction in the pulse width of the pulse signal from the previous stage. In addition, each stage is circuitry that, in effect, compares the pulse width at each stage to a threshold minimum time or duration.

Referring now to FIG. 5, an embodiment of delay line 230 is shown as including multiple stages 501-1 through 501-$m$. The initial stage 501-1 of delay line 230 receives the pulse signal 225 produced by a pulse generator 220. Each stage 501 causes a generally small reduction in the pulse width of the received signal. In the preferred embodiment, each stage 501 is, to the greatest extent possible, identical so that the pulse width reduction at each stage is a constant value. In this implementation, as depicted in FIG. 5, the pulse width of the received signal 225 is equal to Td, which is the delay of interest as described above. Each stage 501 of delay line 230 reduces the pulse width so that the pulse width at the output of any stage 501-$x$ is equal to Td−(n*x) where n represents the amount of pulse width reduction caused by any stage 501. Thus, as depicted in FIG. 5, the pulse width shrinks at each successive stage 501 in delay line 230.

The output of each stage 501 is connected to comparison circuitry 510 that produces a signal 520 indicating the result of the comparison. In one embodiment, each instance of comparison circuitry 510 produces a corresponding digital value 520 (i.e., a 1 or a 0) indicating whether the pulse width at the output of the corresponding stage 501 is less than the threshold time or duration value. Assuming that comparison circuits 510 produce a "1" when the pulse width at the output of the corresponding stage 501 is greater than the threshold, it will be appreciated that the digital signals 520 will transition from a "1" to a "0" at some stage 501 in delay line 230 (the stage at which the pulse width drops below the digital value) and remain "0" thereafter.

In the depicted embodiment, the various digital signals 520 collectively form a digital value 530 having m bits where m is the number of stages in delay line 230. Digital value 530 is an indicator of the duration of the pulse received by delay line 230 because digital value 530 indicates how many stages of delay line 230 were required to reduce the original pulse width below the threshold time or duration value. Because the original pulse width of signal 225 reflects the amount of delay in the PUT 320 (see FIGS. 2, 3, and 4), the digital value 530 indicates the delay associated with a PUT 320.

Figure 8:
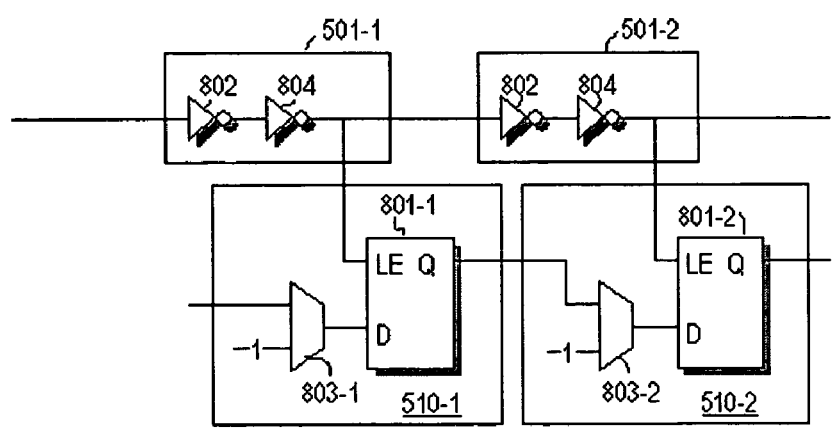
FIG. 8 illustrates a pair of stages in the delay line of FIG. 5 according to an embodiment of the invention.

Referring now to FIG. 8, two stages in an exemplary embodiment delay line 230 are depicted. In the depicted embodiment, each stage 501 includes a corresponding pair of inverters 802 and 804 arranged in series. Inverters 802 and 804 are specifically configured to reduce the pulse width of the received signal.

Figure 11:
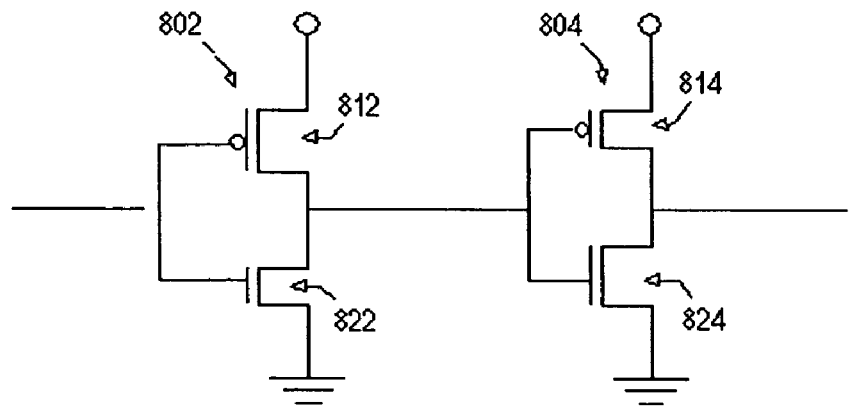
FIG. 11 illustrates additional details of a stage in the delay line of FIG. 5 according to an embodiment of the invention.

In the depicted implementation, inverter 802 is a high P skew inverter and inverter 804 is a high N skew inverter. In the high P skew inverter 802, the PMOS transistor has a larger conductance (g) than the NMOS transistor, thereby enabling inverter 802 to drive low to high transitions faster than it can sink high to low transitions. Conversely, high N skew inverter 804 has an NMOS transistor with a larger conductance than its PMOS transistor, thereby enabling inverter 804 to sink high to low transitions faster than it can drive low to high transitions. This arrangement is depicted in FIG. 11, where high P skew inverter 802 has a PMOS device 812 with a larger conductance than its NMOS device 822 and high N skew inverter 804 has an NMOS device 824 with a larger conductance than its PMOS device 814.

Figure 12:
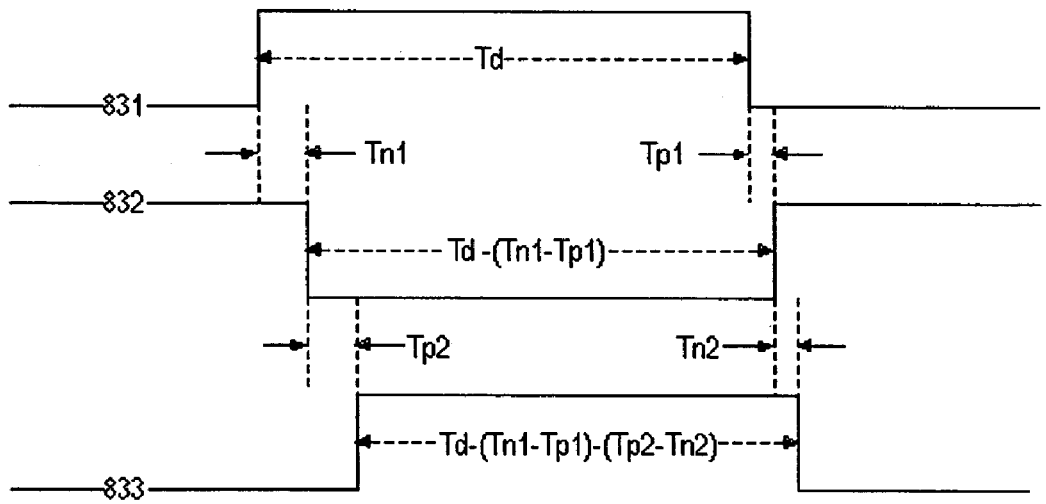
FIG. 12 depicts wave forms of a pulse as it propagates through the stage depicted in FIG. 11.

FIG. 12 depicts an idealized pulse signal propagating through inverters 802 and 804 to illustrate the pulse width reduction that occurs. Signal 831 represents the signal at the input to inverter 802, signal 832 represents the signal at the output of inverter 802 and the input of inverter 804, and signal 833 represents the signal at the output of inverter 804. Initially, signals 831 and 833 are low and signal 832 is high. Those familiar with CMOS transistor operation will appreciate that, in this initial state, PMOS 812 is in saturation (fully conducting) while NMOS transistor 814 is cut off (not conducting).

When signal 831 transitions from low to high, a transition of signal 832 is initiated. This transition is primarily controlled by the amount of time required for the NMOS transistor 822 to pull down the voltage at the output of inverter 802. The time required for NMOS transistor to pull down the inverter output voltage is limited by the ability of NMOS transistor 822 to sink current. Because NMOS transistor 822 is intentionally designed as a weak or slow transistor (relative to PMOS transistor 812), the propagation delay (the amount of time required for NMOS transistor 822 to sink sufficient charge to pull down the inverter output voltage) is relatively long. The propagation delay of transistor 822 is shown graphically in FIG. 12 as Tn1.

When the signal 831 transitions from high to low, a transition from low to high is initiated at the output of inverter 802. In contrast to the first transition, this second transition is controlled by the ability of PMOS transistor 812 to drive current. Because PMOS transistor 812 is relatively faster or stronger than NMOS transistor 822, the propagation delay through the PMOS transistor 812, indicated graphically as Tp1, is less than the propagation delay of NMOS transistor 822. Due to the difference in propagation delays between transistors 812 and 822, the pulse width of signal 832 at the output of inverter 802 is less than the pulse width of signal 831. The amount by which the pulse width is reduced is equal to the difference in propagation delays (i.e., Tn1−Tp1).

An analogous reduction in pulse width occurs between signal 832 at the input of inverter 804 and signal 833 at the output of inverter 804. In this case, the initial transition of signal 833 is from low to high, which is limited by PMOS transistor 814. Because transistor 814 is weaker than its corresponding NMOS transistor 824, the propagation delay, Tp2, through transistor 814 is greater than the propagation delay Tn2, which controls the transition of signal 833 from high to low. Thus, the pulse width of signal 833 is less than the pulse width of signal 832 by the difference in propagation delays (Tp2−Tn2).

Accordingly, the pulse width of the signal 833 at the output of inverter 804 is less than the pulse width of signal 831 by an amount equal to the sum of the two propagation delay differences (i.e., delta pulse width=(Tn1−Tp1)+(Tp2−Tn2)). This delta pulse width value represents the "resolution" of delay line 230 because it represents the smallest value of delay that the case is able to recognize. If the resolution is too large, other embodiments may employ either a first or second inverter that is not a high skew inverter. In such cases, the total reduction in pulse with through a stage 501 would be equal to the propagation delay difference of the single skewed inverter Returning now to the implementation of the delay line of FIG. 5 depicted in FIG. 8, each stage of delay line 230 includes comparison circuitry 510 connected to the output of the corresponding delay line stage 501. Thus, FIG. 8 illustrates a first comparison circuit 510-1 connected to the output of stage 501-1 and a second comparison circuit 510-2 connected to the output of stage 501-2.

In the embodiment depicted in FIG. 8, each comparison circuit 510 is implemented with a conventional DQ flip flop element referred to herein simply as a latch 801. The D input to latch element 801 is connected to a multiplexer 803. The "0" input to multiplexer 803 is connected to the Q output from the latch of the previous stage. The "1" input to multiplexer 803 is tied high (a constant value of logical "1"). During conventional delay path testing, the "1" input to multiplexers 803 is gated to the D input of the corresponding latch 801. The output of the corresponding delay path stage 501 is connected to a latch enable (LE) input of latch 801.

When the pulse width of the pulse signal traversing delay line 230 is sufficiently wide, the pulse acts as a clock signal for latch 801. This clock signal latches the "1" at the D input to the Q output when the LE input is pulsed. At successive stages 801, however, the pulse width is reduced until, at some critical stage, the pulse width provided to the corresponding LE input is not sufficiently wide to latch the D input of the corresponding latch 801 to the Q output and the Q output will remain at logical 0 (where it has been preset) for this stage and all subsequent stages.

The "0" input to multiplexers 803 is used to form a scan line enabling a serial readout of the Q values of latches 801. By chaining latches 801 (through appropriate control of multiplexers 803) and clocking the latches with a scan clock (not shown), the latch output values of successive stages in delay line 230 can be scanned out of the integrated circuit in serial fashion. Inspection of the Q output values indicates the delay associated with the path under test by indicating the number of delay line stages required to reduce the pulse width to approximately zero.

Figure 9:
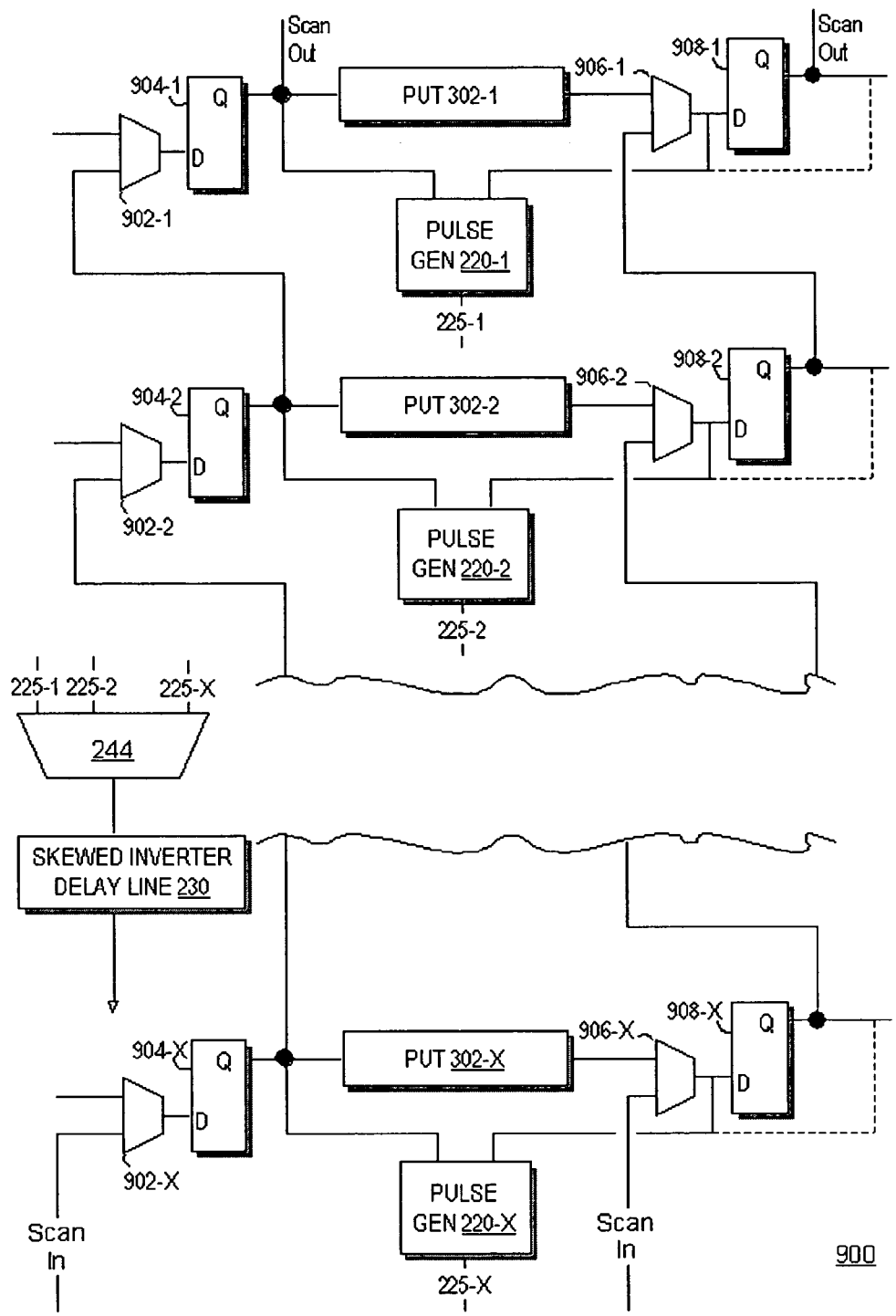
FIG. 9 depicts selected elements of an integrated circuit emphasizing elements facilitating the testing of various delay paths according to an embodiment of the present invention.

Turning now to FIG. 9, selected elements of an integrated circuit 900 that uses delay path measuring circuitry according to one embodiment of the invention are depicted. The elements depicted in FIG. 9 emphasize the delay path measuring circuitry described above with respect to FIG. 2 through FIG. 8. In addition, FIG. 9 depicts multiplexing circuitry useful for providing access to the delay paths 302 using traditional scan line techniques.

Integrated circuit 900 as depicted in FIG. 9 includes the ability to test the delay associated with a plurality of delay paths 302-1 through 302-X. These delay paths are referred to as testable delay paths. Because each testable delay path 302 requires a corresponding pulse generator 220 and some multiplexer and latching elements, the number of testable delay paths is not unlimited. Nevertheless, because the amount of circuitry required for each testable delay path is relatively small and because the delay line 230 is a shared resource, a relatively large number of testable delay paths (e.g., ~100 or more for a VLSI device) may be outfitted with delay measuring circuitry without requiring a substantial increase in die size.

For each testable delay path 302, integrated circuit 900 includes a corresponding pulse generator 220, a delay path input multiplexer 902, a delay path input latch 904, a delay path output multiplexer 906, and a delay path output latch 908. The inputs to each pulse generator 220 are connected to the delay path input signals 210 and the delay path output signals 211. (More precisely, delay path output signal 211 is connected to pulse generator 220 the output of delay path output multiplexer 906).

The delay path input multiplexers 902-1 through 902-X, together with the delay path latches 904-1 through 904-X, provide a scan in path over which a testing device can scan in a predetermined state into the delay path input mechanism as well as a scan out path for scanning out the data from the output of latches 904. Similarly, the delay path output multiplexers 906-1 through 906-X and the delay path output latches 908-1 through 908-X provide a scan in path for scanning data into the delay path output latches 908 and a scan out path for scanning data out of the delay path output latches 908.

In the depicted embodiment, a dashed line connects the outputs of data path output latches 908 to the corresponding pulse generator 220. This dashed represents an alternative implementation to the implementation (depicted with a solid line) connecting the output of delay path output multiplexer 906 to the pulse generator 220. The implementation represented by the dashed line incorporates the propagation delay of delay path output latch 908 into the pulse signal 225 generated by pulse generator 220. In addition, this alternative embodiment will incorporate any clock signal skew into the pulse width of pulse signal 225. More specifically, if there is skew between the clock signal that clocks delay path input latch 904 and the clock signal that clocks delay path output latch 908, the clock signal skew will be reflected in the pulse width of pulse signal 225. The inclusion of the propagation delay associated with delay path output latch 908 and the latch clock signal skew may or may not be desirable depending upon the desired objective.

Figure 10:
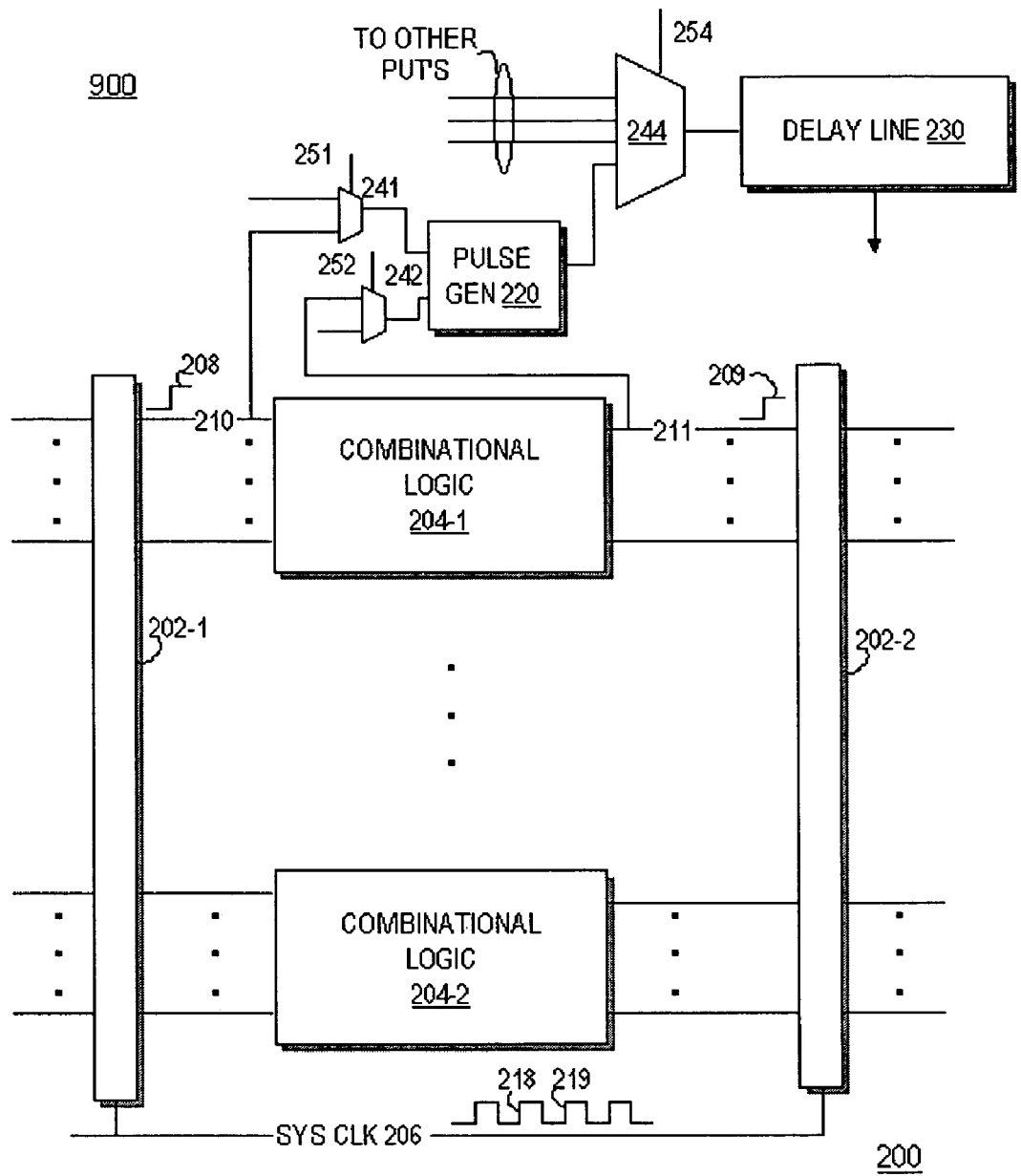
FIG. 10 depicts selected elements of the integrated circuit of FIG. 9.

Referring now to FIG. 10, selected elements of integrated circuit 900 are depicted to emphasize additional functionality. For the sake of clarity, FIG. 10 omits the individual PUT's 320 and the scanning circuitry of FIG. 9. As depicted in FIG. 10, integrated circuit 900 includes combinational logic block 204-1, 204-2, etc. A transition 208 of an input signal 210 provided to combinational logic block 204-1 causes a transition 209 on an output signal 211. Input and output signals 210 and 211 are connected to the circuitry that is configured to generate information indicative of the delay between transition 208 and 209.

As depicted in FIG. 10, the pulse generator 220 that receives the input signal 210 and output signal 211 includes a pair of multiplexers 241 and 242. During periods when circuit 900 is measuring delay, the multiplexers 241 and 242 are controlled to connected pulse generator 220 to input and output signals 210 and 211. Prior to measuring delay, however, it is desirable to calibrate delay line 230 by stimulating the delay measuring circuitry with transitions that are delayed by a known interval. In this calibration mode, multiplexers 241 and 242 connected pulse generator 220 to a pair of externally controlled signals 251 and 252. A testing machine may be connected to these signals to produce a pair of signal transitions delayed by a predetermined interval.

The pulse generator 220 produces a pulse signal 225 having a known pulse width that is provided to delay line 230. In this manner, a test technician may calibrate a value produced by delay line 230 to a known duration. An analogous technique may be used to calibrate the resolution of delay line 230 (the minimum amount of delay that delay line 230 is capable of detecting) by varying the delay between the externally generated signals until a change in the output produced by delay line 230 is observed.

FIG. 10 also emphasizes the use of a shared delay line 230. In the depicted configuration, the outputs from various pulse generators 220 associated with various PUT's within integrated circuit 900 are provided to a large multiplexer 244 that is controlled by a control signal 254. Control signal 254 determines which pulse generator 220 (i.e., which PUT) is connected to delay line 230.

It will be apparent to those skilled in the art having the benefit of this disclosure that the present invention a integrated circuit incorporating delay path measuring circuitry. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. An integrated circuit, comprising:
    a delay path, wherein a transition of an input signal to said delay path causes a subsequent transition of an output signal from said delay path;
    a pulse generator configured to receive said input signal and said output signal for generating a pulse signal having a pulse width indicative of a delay between said input signal transition and said output signal transition, wherein said pulse generator includes a first multiplexer for receiving said input signal, a second multiplexer for receiving said output signal, and a logic gate for combining outputs from said first multiplexer and second multiplexer to provide said pulse signal;
    wherein said first and second multiplexers selectively controlled by a rise/fall select signal;
    wherein said delay path can be an inverting delay path or a non-inverting delay path; and
    a delay line configured to receive said pulse signal from said pulse generator to generate information indicative of said pulse width of said pulse signal.

2. The integrated circuit of claim 1, wherein said delay line includes multiple stages connected in series, wherein said stages are configured to reduce said pulse width of said pulse signal.

3. The integrated circuit of claim 2, wherein each of said stages includes a high skew inverter having a PMOS transistor and an NMOS transistor, wherein the gain of said PMOS and NMOS transistors is significantly different from each other.

4. The integrated circuit of claim 3, wherein said pulse signal is a positive-going pulse regardless of whether said delay path is an inverting or non-inverting delay path.

5. The integrated circuit of claim 2, wherein each of said stages includes a first high skew inverter connected in series with a second high skew inverter, wherein said first high skew inverter includes a high conductance PMOS inverter and a low conductance NMOS inverter, wherein said second high skew inverter includes a low conductance PMOS inverter and a high conductance NMOS inverter.

6. The integrated circuit of claim 2, wherein the output of each of said stages in said delay line is connected to a comparison circuit capable of producing a signal indicative of whether said pulse width exceeds a threshold time value.

7. The integrated circuit of claim 6, wherein said comparison circuit includes a latch having a latch enable input and a D input, wherein said D input is connected to a logical constant and said latch enable input is connected to said delay line stage output.

8. The integrated circuit of claim 7, wherein said integrated circuit further includes a scanning circuit for scanning the outputs of said comparison circuit latches out of said integrated circuit.

9. The integrated circuit of claim 1, wherein said integrated circuit further includes a circuit for scanning data into said delay path input signals and a circuit for scanning out said delay path out signals.

10. The integrated circuit of claim 1, wherein said integrated circuit further includes additional delay paths, wherein each of said additional delay paths is associated with a corresponding pulse generator, wherein all of said additional delay paths shares a common delay line.

11. The integrated circuit of claim 1, wherein said integrated circuit further includes an AND gate for combining outputs of said first and second multiplexers to generate said pulse signal.

12. An integrated circuit, comprising:
    a delay path having a combinational circuit connected between a pair of latches;
    means for producing a pulse having a width indicative of a delay between a transition of an input signal of said delay path and a resulting transition of an output signal of said delay path; and
    a skewed delay line for receiving a pulse, wherein said skewed delay line includes multiple stages, wherein each of said stages is configured to reduce the pulse width of a signal received from a preceding stage, wherein each of said stages includes a comparison circuit configured to determine whether or not a pulse width within a corresponding stage exceeds a threshold duration value.

13. The integrated circuit of claim 12, wherein said integrated circuit further includes means for scanning data into said delay path and for scanning out information indicative of said delay.

14. The integrated circuit of claim 13, wherein a stage in said skewed delay line includes a high skew inverter having a PMOS and an NMOS transistor, wherein a conductance of said PMOS transistor differs from a conductance of said NMOS transistor.

15. The integrated circuit of claim 14, wherein said high skew inverter has a high conductance PMOS transistor and a low conductance NMOS transistors, wherein said stage further includes another high skew inverter connected in series with said high skew inverter, wherein said another high skew inverter has a high conductance INMOS transistor and a low conductance PMOS transistor.

* * * * *